(12) United States Patent
Goorjian (10) Patent No.: US 7,333,735 B1
(45) Date of Patent: Feb. 19, 2008

(54) COMMUNICATION USING VCSEL LASER ARRAY

(75) Inventor: Peter M. Goorjian, Oakland, CA (US)

(73) Assignee: United States of America as Represented by the Administrator of the National Aeronautics and Space Administration (NASA), Washington, DC (US)

( * ) Notice: Subject to any disclaimer, the term of this patent is extended or adjusted under 35 U.S.C. 154(b) by 511 days.

(21) Appl. No.: 10/885,533

(22) Filed: Jun. 30, 2004

Related U.S. Application Data (63) Continuation-in-part of application No. 10/171,554, filed on Jun. 10, 2002, now Pat. No. 6,865,208.

(51) Int. Cl.
*H04B 10/00* (2006.01)

(52) U.S. Cl. .................. 398/182; 398/183; 398/118

(58) Field of Classification Search ........ 398/182–201, 398/118–131
See application file for complete search history.

(56) References Cited

U.S. PATENT DOCUMENTS

| | | | | |
|---|---|---|---|---|
| 4,894,833 A * | 1/1990 | Carlin | .................... | 372/44.01 |
| 5,204,870 A | 4/1993 | Faist et al. | | |
| 5,243,619 A * | 9/1993 | Albers et al. | ................. | 372/97 |
| 5,475,416 A | 12/1995 | Kessler et al. | | |
| 5,561,683 A * | 10/1996 | Kwon | ......................... | 372/96 |
| 5,572,540 A * | 11/1996 | Cheng | ..................... | 372/50.12 |
| 5,574,744 A | 11/1996 | Gaw et al. | | |
| 5,576,879 A | 11/1996 | Nashimoto | | |
| 5,625,636 A * | 4/1997 | Bryan et al. | ........... | 372/50.124 |
| 5,727,014 A * | 3/1998 | Wang et al. | ................... | 372/96 |
| 5,781,671 A * | 7/1998 | Li et al. | ....................... | 385/17 |
| 5,898,722 A * | 4/1999 | Ramdani et al. | ....... | 372/50.121 |
| 6,016,326 A | 1/2000 | Claisse et al. | | |
| 6,091,537 A | 7/2000 | Sun et al. | | |
| 6,128,324 A * | 10/2000 | Shah et al. | .............. | 372/50.22 |
| 6,130,873 A | 10/2000 | Lazarev et al. | | |
| 6,144,685 A * | 11/2000 | Iwasa et al. | ............. | 372/50.12 |
| 6,272,160 B1 | 8/2001 | Stronczer | | |
| 6,285,704 B1 | 9/2001 | Kullander-Sjoberg et al. | | |
| 6,399,936 B1 | 6/2002 | Hang et al. | | |
| 6,411,425 B1 * | 6/2002 | Kowarz et al. | ............. | 359/291 |
| 6,466,349 B1 * | 10/2002 | Valley et al. | ............... | 398/182 |

(Continued)

OTHER PUBLICATIONS

"Agilant Technologies' New fiber Optic Transceivers Offer Industry's Lowest EMI Emi . . . ", Business Wire, http://www.profound.com/htbin/get_pin, The Dialog Corp., Jul. 10, 2001.

(Continued)

*Primary Examiner*—Agustin Bello
(74) *Attorney, Agent, or Firm*—John F. Schipper; Robert M. Padilla (57) ABSTRACT

Ultrafast directional beam switching, using coupled VCSELs is combined with a light modulator to provide information transfer at bit rates of tens of GHz. This approach is demonstrated to achieve beam switching frequencies of 32-50 GHz in some embodiments and directional beam switching with angular differences of about eight degrees. This switching scheme is likely to be useful for ultrafast optical networks at frequencies much higher than achievable with other approaches. A Mach-Zehnder interferometer, a Fabry-Peror etalon, or a semiconductor-based electro-absorption transmission channel, among others, can be used as a light modulator.

34 Claims, 8 Drawing Sheets

U.S. PATENT DOCUMENTS

| | | | | |
|---|---|---|---|---|
| 6,567,454 | B1* | 5/2003 | Fischer et al. | 372/68 |
| 6,600,765 | B2* | 7/2003 | Evans et al. | 372/50.1 |
| 6,680,788 | B1* | 1/2004 | Roberson et al. | 359/210 |
| 6,721,472 | B2* | 4/2004 | Kim | 385/16 |
| 6,959,027 | B1* | 10/2005 | Guilfoyle et al. | 372/50.1 |
| 6,967,986 | B2* | 11/2005 | Kowarz et al. | 372/102 |
| 7,110,428 | B2* | 9/2006 | Jagadish et al. | 372/44.01 |
| 7,116,694 | B2* | 10/2006 | Peters et al. | 372/50.12 |
| 2003/0091084 | A1* | 5/2003 | Sun et al. | 372/50 |
| 2003/0107793 | A1* | 6/2003 | Capps | 359/290 |
| 2006/0018216 | A1* | 1/2006 | Morris et al. | 369/47.1 |

OTHER PUBLICATIONS

"Agilent Technologies Rolls Out Complete Physical Layer Gigabit Ethernet Solu . . . ", Newsroom, http://www.agilent.com/about/newsroom/presrel/2000/14feb2000a.html, Feb. 14, 2000.

Babic, The Interior Design of the New Laser, IEEE Spectrum, Feb. 1998 V. 35-2.

Babic, New Muxed Laser Arrays, IEEE Spectrum, Feb. 1998, V. 35-2, Institute of Electrical and Electronics Engineers, Inc.

Chang-Hasnain, Vertical-Cavity Surface Emitting Lasers', Semiconductor Lasers Past, Present, and Future, 1995, 145 & 156-159, AIP Press,Woodbury, New York.

Corzine, Semiconductor Light-Source Essentials, IEEE Spectrum, Feb. 1998, V. 35-2, Institute of Electrical and Electronics Engineers, Inc.

Fan, et al., Dynamic beam Switching of Vertical-Cavity Surface-Emitting Lasers with Integrated Optical Beam Routers, IEEE Photonics Technology Letters, Apr. 1997, 505-507, IEEE.

Fan, et al., Novel Vertical-Cavity Surface Emitting Lasers with Integrated Optical Beam Router, Electronic Letters, Apr. 27, 1995, 729-730, 31-9, IEEE.

Fish, Tunable Lasers Will Impact Optical Nets, EE Times, http://www.eetimes.com/story/OEG20010925S0070, Sep. 25, 2001, CMP Media LLC.

Fishman, et al., Cyclic Vertical Cavity Semiconductor Laser Arrays With Odd Numbers of Elements: . . . , Optics Letters, Apr. 15, 1996, 600-602, 21-8, Optical Society of America.

Giboney, et al., The Ideal Light Source for Datanets, IEEE Spectrum, Feb. 1998, V. 35-2, The Institute of Electrical an Electronics Engineers, Inc.

Goorjian, et al., Numerical Simulation of Ultrafast Directional . . . , Integrated Photonics Research 2001, Jun. 11-13, 2001, Paper IWA4, Optical Society of America, Monterey, CA.

Goorjian, et al., Simulations of Spa . . . , Nonlinear Optics: Materials, Fundamentals and Aplications, Aug. 7-11, 2000, 380-382, Optical Society of America, Kauai-Lihue, Hawaii.

Goorjian, et al., Transverse Mode Dynamics of VCSELs Through Space-Time Domain Simulation, Optics Express, Aug. 2, 1999, 55-62, 5-3, Optical Society of America.

Goorjian, et al., Ultrafast Beam . . . , 15th Institute of Physics Quantum Electronics and Photonics 2001 Joint Conference, Sep. 3-6, 2001, Paper 1, Glasgow, Scotland.

Guenter, et al., Commercialization of Honeywell's VCSEL Technology: Further Developments, Proceedings of the SPIE, 2001, vol. 4286, SPIE.

Hecht, VCSELs Turn to High-Speed Transmission Optical Networking: Vertic . . . , Laser Focus World-Optoelectronics and Laser Technology Advances, Feb. 2001, PennWell Corporation.

Held, On the Road to OC-768, IT Pro, 1520-9202/01, Mar./Apr. 2001, 46-48, IEEE.

Hohimer, et al., Near-Diffraction-Limited Angle-Switchable Output Beam from a Broad . . . , Applied Physics Letter, Jun. 24, 1991, 2886-2888, 58-25, American Institute of Physics.

Honeywell VSCEL High Speed Characteristics, http://content.honeywell.com/vcsel/advantage/highspeed.stm, 1998-2001, 2 pages, Honeywell Inc.

Jones-Bey, VCEL Makers Storm 1300-nm Telecom Castle, Laser Focus World, Aug. 2001, 3 pages, PennWell Corporation.

Lebby, Optoelectronic Devices and Packaging: VCSEL Technology, 4th IEEE Workshop on AST, Phoenix Applied Research Center, Jan. 1998, 10 pages, IEEE.

Matsumoto, et al., Optical Suppliers to Demo 100-Gbit Connections, EE Times, http://www.eetimes.com/story/OEG2001601S0053, Jun. 1, 2001, 2 pages, CMP Media LLC.

Modulating VCSELs, Honeywell Application Sheet, Micro Switch Sensing and Control, 006703-1-EN IL50 GLO 498, 19 pages, Honeywell, Inc.

Multi-Vendor, Interoperability Demonstration Shows Serial 850 nm Optical Links . . . Business Wire, http://www.profound.com/htbin/get_pin, Sep. 18, 2001, 2 pages, The Dialog Corp.

Murray, VCSEL Transceiver Market Triples Consumption, Laser Focus World-Optoelectronics and Laser Technology Advances, Feb. 2001, 2 pages PennWell Corporation.

Natan, et al., Localization Immunity and Coherence of Extended Two-Dime . . . , Journal of Optical Society of America B, Jun. 1997, 1501-1504, 14-6, Optical Society of America.

Ning, et al., Effective Bloch-Equations for Semiconductor Lasers and Amplifiers, IEEE Journal of Quantum Electronics, Sep. 1997, 1543-1550, 33-9, IEEE.

Ning, et al., Microscope Modeling and Simulation of Transverse-Mod . . . , Journal of Optical Society of America B, Nov. 1999, 2072-2082, 16-11, Optical Society of America.

Orenstein, et al., Supermodes of Hermite Tapered Arrays of Vertical-Cavity Semiconductor Lasers, IEEE Journal of Quantum Electronics, Jul. 1999, 1062-1066, 35-7, IEEE.

Parallel Optical Interconnect Module Ships, EE times, http://www.eetimes.com/story/OEG20010730S0015, Jul. 30, 2001, 2 pages, CMP Media LLC.

Schneider, Jr., Eptaxial Growth of the Surface-Emitting Laser, IEEE Spectrum, Feb. 1998, 2 pages, 35-2, The Institute of Electrical and Electronics Engineers, Inc.

Schneider, Jr., A New Planar Laser, IEEE Spectrum, Feb. 1998, 2 pages, 35-2, The Institute of Electrical and Electronics Engineers, Inc.

Simoneax, VCSELs Propel 10-Gvit Ethernet, EE Times Http://www.eetimes.com/story/OEG20010806S0059, 4 pages, CMP Media LLC, Aug. 6, 2001.

Sun, et al., Thermally Controlled Lateral Beam Shift and Beam Steering in Semiconductor Lasers, IEEE Photonics Technology Letters, Jan. 1995, 26-28, 7-1, IEEE.

Superdata (10/40/160 G BPS/Channel) Deployment, http://www.electronicast.com/rrrparts/rrr_5.html, 1 page.

Tatum, et al., VCSELs in the Information Age, SPIE Optics in Information Systems Newsletter, Apr. 2001, 2 pages, SPIE.

First Office Action, dated Feb. 13, 2003, U.S. Appl. No. 10/171,554, filed Jun. 10, 2002.

Final Office Action, dated Nov. 6, 2003, U.S. Appl. No. 10/171,554, filed Jun. 10, 2002.

* cited by examiner

COMMUNICATION USING VCSEL LASER ARRAY

CROSS REFERENCE TO RELATED APPLICATIONS

This application is a continuation-in-part of prior application Ser. No. 10/171,554, filed Jun. 10, 2002, now U.S. Pat. No. 6,865,208.

ORIGIN OF THE INVENTION

The invention described herein was made by an employee of the United States Government and may be manufactured and used by or for the Government for government purposes without the payment of any royalties thereon or therefor.

TECHNICAL FIELD OF THE INVENTION

The present invention relates to information transmission using optical communication systems, including a combination of two or more vertical-cavity surface emitting lasers (VCSELs).

BACKGROUND OF THE INVENTION

The limits to switching and modulation speed of semiconductor lasers are fundamental bottlenecks for information processing and transmission in optical communication systems. These limits come from the relatively slow carrier recombination lifetime in the III-V semiconductors used for optical applications. Though progress in pushing this limit in the past has been made, these improvements cannot meet the demand for higher speed in the long run. A new paradigm has to be explored to maintain the momentum of technology development.

The ability to steer or switch the propagation direction of a laser beam in a controllable way is very important for many applications, and especially for optical interconnect networks. Beam scanning and steering in edge emitting lasers have been realized using thermal control (See Y. Sun, C. G. Fanning, S. A. Biellak, and A. E. Siegman, IEEE Photonics Technol. Lett. 7,26(1995)) and spatial phase controlling techniques (See J. P. Hohim, D. C. Craft, G. A. Vawter, and D. R. Myers, Appl. Phys. Lett. 58, 2886 (1991)). For optical interconnect applications, all the well-known advantageous attributes of vertical_cavity surface emitting lasers (VCSELs) make them especially appealing elements. However, full advantage cannot be taken of compact two-dimensional (2D) VCSEL arrays if bulky external passive optical elements are used for routing and switching. For this reason, routers integrated together with VCSELs that can be controlled electronically are especially important to reduce the overall volume of an interconnect network. See L. Fan, M. C. Wu, and P. Gradzinski, Electron. Lett. 31, 729 (1995) and L. Fan, M. C. Wu, H. C. Lee, and P. Grodzinski, IEEE Photonics Technol. Lett. 9, 505(1997).

Recently it has been demonstrated that, by introducing a phase-shifter in part of the VCSEL cross-section, beam switching of up to 2 gigahertz can be achieved. Another more conventional approach to VCSEL beam manipulation is to use VCSEL arrays. Indeed, VCSEL arrays of various kinds have been quite extensively researched for tailoring and engineering near and far field patterns. See M. Orenstein, and T. Fishman, "Supermodes of Hermite Tapered Arrays of Vertical-Cavity Semiconductor Lasers," IEEE Jour. Quantum Electron. 35, 1062-1066 (1999). See D. Natan, M. Margalit, and M. Orenstein, "Localization Immunity And Coherence Of Extended Two-Dimensional Semiconductor Vertical Cavity-Locked Laser Arrays," Jour. Opt. Soc. Am. B 14, 1501-1504, (1997). See T. Fishman, and M. Orenstein, "Cyclic Vertical Cavity Semiconductor Laser Arrays With Odd Numbers Of Elements: Lasing Modes And Symmetry Breaking," Opt. Lett. 21, 600-602, (1996).

Optical communications in terrestrial environments and in space require very high frequency transmitted signals, of the order of 40 GHz and higher, in part because of the uncertain and changing transmission environments. What is needed is a robust optical communication system that will provide these frequencies, that provides substantial discrimination between different symbols, that permits switching times of the order of 0.25 picoseconds, and that permits the use of two or more distinct symbols.

SUMMARY OF THE INVENTION

These needs are met by the invention, which uses external modulation of light issued from an array of two or more coherently coupled VCSEL lasers to provide a very high frequency, fast switching output beam for terrestrial and/or space communications.

A basic embodiment of the invention includes applications of an array of vertical cavity surface emitting lasers (VCSELs) spatially coupled together; a current source connected to the VCSELs, with a steady current biased above threshold current, where the coupling of the VCSELs produces an output laser beam having a spatial oscillation. A switching device is shown that transfers the near laser field emitted by two or more coupled VCSELS to two receivers, where external modulation is then used. Another embodiment produces a far field device where two VCSELs produce an output beam that is also received and processed by an external modulation system The invention is based on computer simulations of the light output of an array of two or more coupled VCSELs. The model equations that are solved on the computer are an approximation to the semi-conductor Maxwell Bloch equations.

This disclosure illustrates that the resulting far field pattern has two lobes that oscillate out of phase and are useful for beam switching. Dynamic beam switching of vertical-cavity surface-emitting lasers (VCSELs) has important applications for switching and routing in optical interconnect networks.

The time evolution of the spatial profiles of the laser and carrier density is obtained by solving the coupled partial differential Maxwell—Bloch equations that govern beam evolution, using a finite-difference algorithm. The algorithm is fairly general and can handle devices with one or multiple active regions of any shapes, which can be either gain or index guided. The physical modeling includes the effects of nonlinear carrier dependence and dispersion with respect to wavelength on the optical gain and refractive index. The modeling of the optical susceptibility is based on first-principles and includes device details such as a quantum well structure and many-body effects.

The invention produces an optical data stream (e.g., 0's and 1's) from an external modulator that receives an optical pulse train from an array of coherently coupled VCSELs. A basic embodiment of the invention includes the VCSELs that are transmitting the optical pulse train and the external modulator, which receives the optical pulse train and produces an optical bit stream of symbols that may represent "0" and "1" symbols or some other set of two or more symbols. This embodiment applies external modulation technology to an array of two or more coherently coupled VCSELs to generate a signal on the optical pulse train. Suitable external modulation technologies include, but are not limited to, a Mach-Zehnder interferometer, a Fabry-Perot etalon and an electromagnetically saturable transmission medium, and an electro-optic crystal.

Optical data are transmitted by modulating either the amplitude, or the phase, or the frequency of the optical carrier, (See *Fiber-Optic Communication Systems*, Govand P. Agrawal, Wiley Inter-Science, First Ed., 1992, and Third Ed., 2002). In digital communication systems, the three possibilities give rise to three modulation formats known as amplitude-shift keying (ASK), phase-shift keying (PSK), and frequency-shift keying (FSK). For the pulse train generated by coherently coupled VCSELs, all these formats can be used.

In the ASK format, the electrical field amplitude is modulated and the frequency and phase of the optical carrier are kept substantially constant. For binary digital modulation, the electrical field amplitude takes one of two distinct fixed values (e.g., "0" and "1") during each bit period. Optionally, the electric field is set to zero during the transmission of a "zero" bit. The ASK format is called on-off keying (OOK) in this version and is identical with the modulation scheme IM/DD, (intensity modulation and direct detection), commonly used for noncoherent digital lightwave systems. The implementation of ASK for coherent systems is performed by external modulation.

A commonly used external modulator makes use of $LiNbO_3$ waveguides in a Mach-Zehnder interferometer (MZI) configuration, (See F. Heismann, S. K. Korotky, and J. J. Veselka, in *Optical Fiber Telecommunications III*, Vol. B, I. P. Kaminow and T. L. Loch, Eds., Academic Press, San Diego, Calif., 1997, Chapter 8). The performance of external modulators is quantified through an on-off ratio in excess of 20 and can be modulated at speeds up to 75 GHz. Other materials can also be used to make external modulators. The $LiNbO_3$ external modulator is used to impose the signal on the pulse train. The external modulator blocks the pulse whenever a "0", bit is transmitted and generates a bit stream in which the presence or absence of a pulse corresponds to "1" and to "0" values, respectively.

In another embodiment, the VCSEL laser output beam(s) is modulated by an electro-absorption module that has a light absorption state and a light transmission state, depending upon the value of a voltage difference impressed across a semiconductor layer that receives and transports the output beam(s).

In the PSK format, the optical bit stream is generated by modulating the electrical field phase while the amplitude and the frequency of the optical carrier are kept constant. For binary PSK, the phase takes two values, commonly chosen to be 0 and phi (a selected value different from 0). The implementation of PSK requires an external modulator capable of changing the optical phase in response to an applied voltage. The physical mechanism used by such modulators is called electrorefraction. Any electro-optic crystal with proper orientation can be used for phase modulation. An $LiNbO_3$ or $TaNbO_{3c}$ crystal is commonly used in practice. Semiconductors can also be used to make phase modulators, especially if a muli-quantum-well (MQW) structure is used. Such MQW phase modulators have been developed, (See F. Heismann, S. K. Korotky, and J. J. Veselka, in *Optical Fiber Telecommunications III*, Vol. B, I. P. Kaminow and T. L. Loch, Eds., Academic Press, San Diego, Calif., 1997, Chapter 8), and are able to operate at a bit rate of up to 40 Gigabits per second.

In the FSK format, information is coded on the optical carrier by shifting the carrier frequency between two or more frequency values. For a binary digital signal, the carrier frequency is shifted to a slightly higher or slightly lower frequency depending on whether a 1 or 0 bit is being transmitted. The shift in frequency is called the frequency deviation and the frequency spacing between the 1 and 0 bits is called the tone spacing. The implementation of FSK requires modulators capable of rapidly shifting the frequency of the incident optical signal. Electro-optic (EO) materials such as $LiNbO3$ normally produce a phase shift proportional to the applied voltage. An EO material can be used for FSK by applying a triangular voltage pulse (sawtooth-like), since a linear phase change corresponds to a frequency shift. An alternative technique makes use of Bragg scattering from acoustic waves and is referred to as an acousto-optic modulator.

DESCRIPTION OF BEST MODES OF THE INVENTION

A method of directional beam switching is disclosed that uses two or more closely coupled vertical cavity surface emitting lasers (VCSELs). When two or more VCSELs are coupled by a small inter-VCSEL separation and are biased at the same steady current near threshold, the resulting light output is spatially oscillating at an extremely high frequency. The invention is based on computer simulations of the light output of coupled VCSELs. The model equations that are solved on the computer are an approximation to the semiconductor Maxwell-Bloch equations. Simulations have been performed for two coupled VCSELs operating at 980 nm with circular current apertures of 5.6 μm in diameter, and the resulting switching frequency is at 42 GHz. The far field beams are separated by about eight degrees. The near field pattern shows two spots that oscillate in relative intensity. However, these spots oscillate ninety degrees out of phase with respect to the oscillation in the far field pattern. Simulations that use two square VCSELs have been performed that increase the frequency to 50 GHz and the far field pattern remains similar. For three round VCSELs in a ring pattern, the far field beam moves in a circular pattern at a frequency of 31 GHz. For four round VCSELs in a square pattern, two far field circularly shaped beams move left and right at a frequency of 50 GHz.

As shown in FIGS. 1A-1F and FIGS. 2A-2F, the resulting far field pattern has two lobes that are oscillating out of phase and are useful for beam switching. See Peter Goorjian and Cun-Zheng Ning: "Numerical Simulation of Ultrafast Directional Beam Switching in Coupled VCSELs," Paper IWA4, IPR 2001, Integrated Photonics Research 2001, Optical Society of America, Monterey, Calif., Jun. 11-13, 2001, incorporated herein by reference and Peter Goorjian and Cun-Zheng Ning: "Ultrafast Beam Self-Switching by Using Coupled VCSELs," Paper 1 in Session Nonlinear Optics I, QEP-15/Photonics 2001 15th Institute of Physics Quantum Electronics and Photonics/QEP-15 2001 joint conference, University of Strathclyde, Glasgow, Scotland, Sep. 3-6, 2001.

For a discussion of the semiconductor Maxwell-Bloch equations upon which the present invention were modeled, see C. Z. Ning, R. A. Indik and J. V. Moloney, "Effective Bloch-Equations For Semiconductor Lasers And Amplifiers," IEEE Jour. Quantum Electron. 33, 1543-1550, (1997). The time evolution of the spatial profiles of the laser and carrier density is obtained by solving the coupled partial differential equations by a finite-difference algorithm that governs the evolution of the spatial profiles. The algorithm is fairly general and can handle devices with one or multiple active regions of any shapes, which can be either gain or index guided. See P. M. Goorjian, C. Z. Ning, and G. P. Agrawal, "Simulations of Spatial Dynamics in Vertical-Cavity Surface-Emitting Laser Arrays," Paper ThB22, Nonlinear Optics: Materials, Fundamentals and Applications, OSA, Kauai-Lihue, Hi., Aug. 7-11, 2000. No a priori assumption is made about the type or number of modes. The physical modeling includes the effects of nonlinear carrier dependence and dispersion with respect to wavelength on the optical gain and refractive index. The modeling of the optical susceptibility is based on first-principles and includes device details such as a quantum well structure and many-body effects. See P. M. Goorjian and C. Z. Ning, "Transverse mode dynamics of VCSELs through space-time simulation," Opt. Express 5, 55-62, (1999). See C. Z. Ning and P. M. Goorjian, "Microscope Modeling And Simulation Of Transverse Mode Dynamics Of Vertical-Cavity Surface-Emitting Lasers," Jour. Opt. Soc. Am. B 16, 2072-2082, (1999). Temporal dynamics as fast as on a picosecond scale can be resolved. This bottom-up approach uses measured material parameters and quantum well structure parameters, with the number of free parameters minimized. The VCSELs given herein are based on InGaAs/GaAs quantum well structures.

Further calculations were made to show the effects of varying the inter-VCSEL separation, the injection current and the VCSEL size on the frequency, relative brightness and angular separation of the two beams. Similar studies were made of VCSELs arrayed in a ring pattern.

Figure 1A:
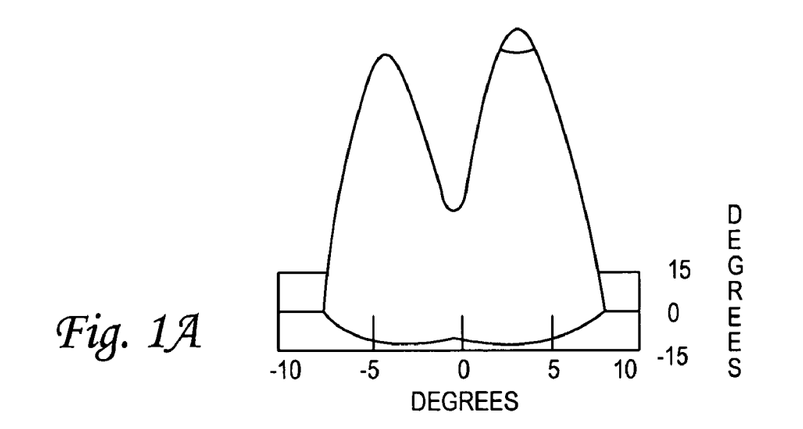
FIGS. 1A-1F show a perspective view of the far field beam intensity over one and one-half cycles of beam switching. The switching speed is forty-two gigahertz and the beams are separated by about eight degrees.
Figure 1B:
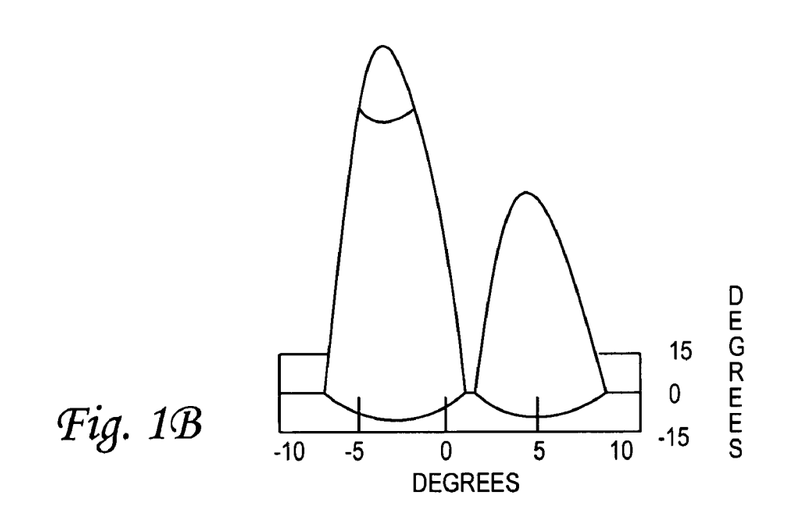
Figure 1C:
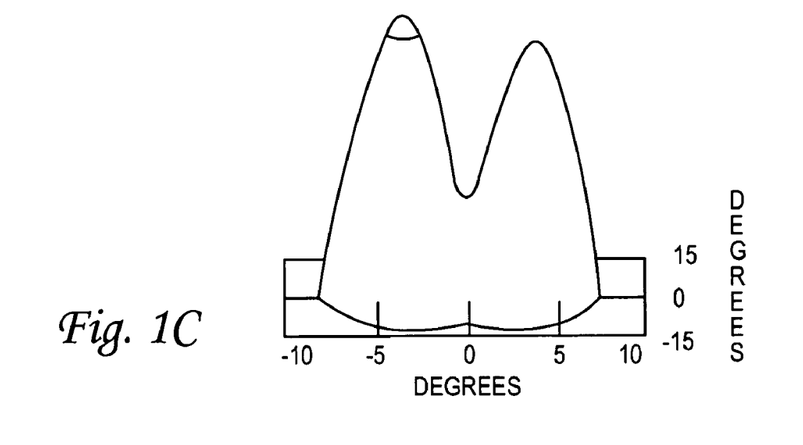
Figure 1D:
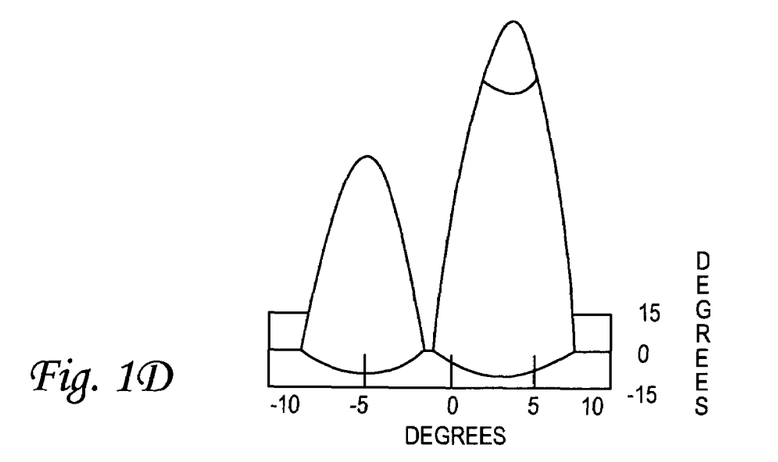
Figure 1E:
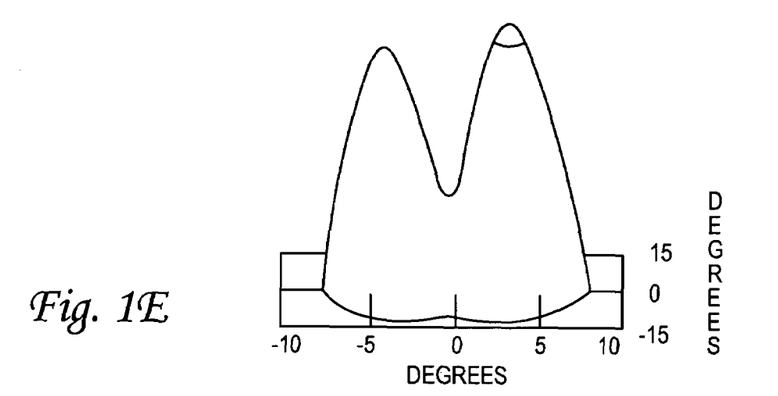
Figure 1F:
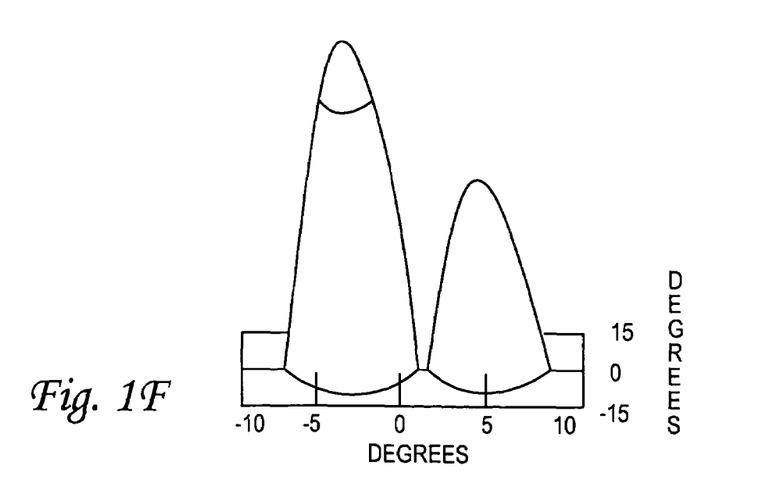
Figure 2A:
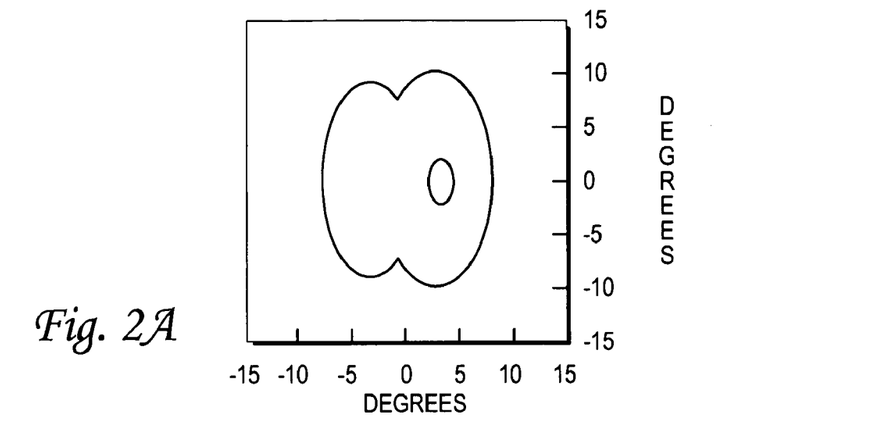
FIGS. 2A-2F show the top view of the far field beam intensity over one and one-half cycles of beam switching. As in FIGS. 1A-1F, the switching speed is forty-two gigahertz and the beams are separated by about eight degrees.
Figure 2B:
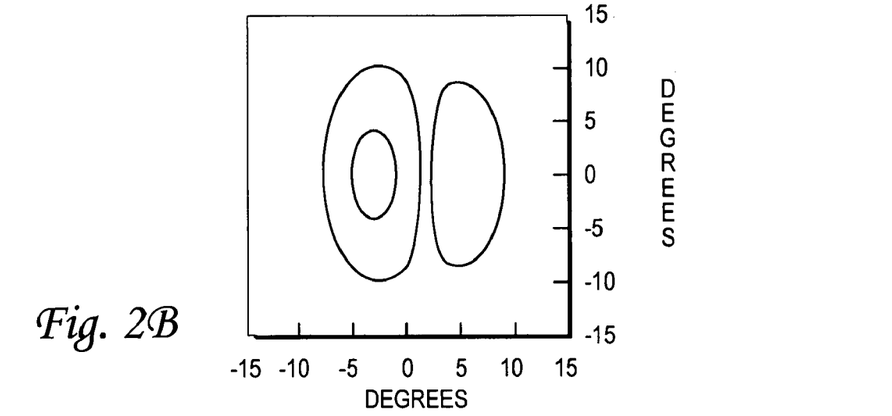
Figure 2C:
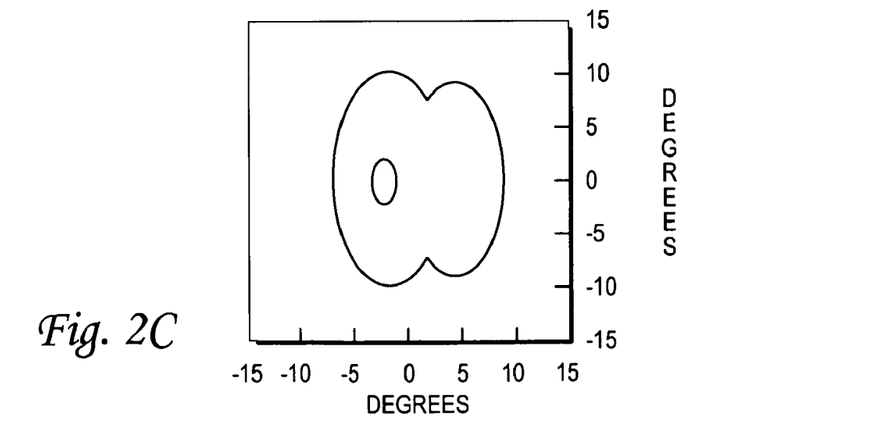
Figure 2D:
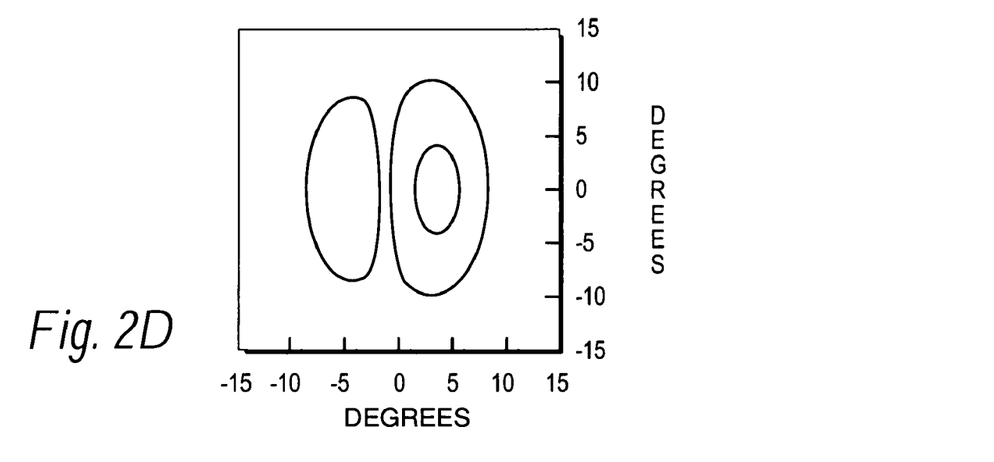
Figure 2E:
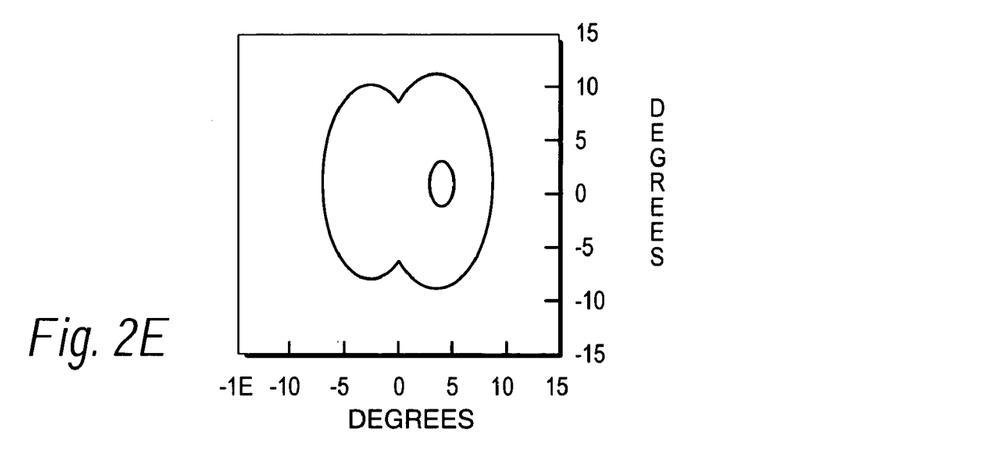
Figure 2F:
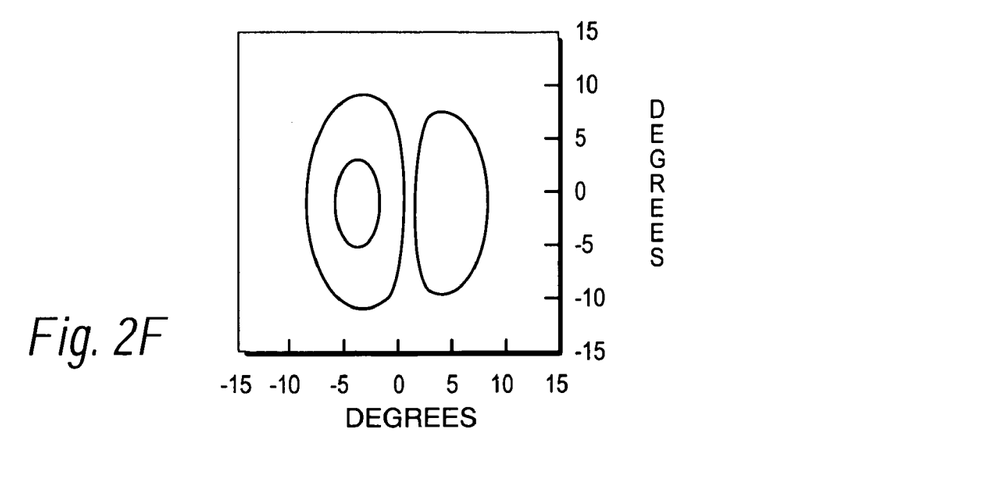
Figures 3, 4:
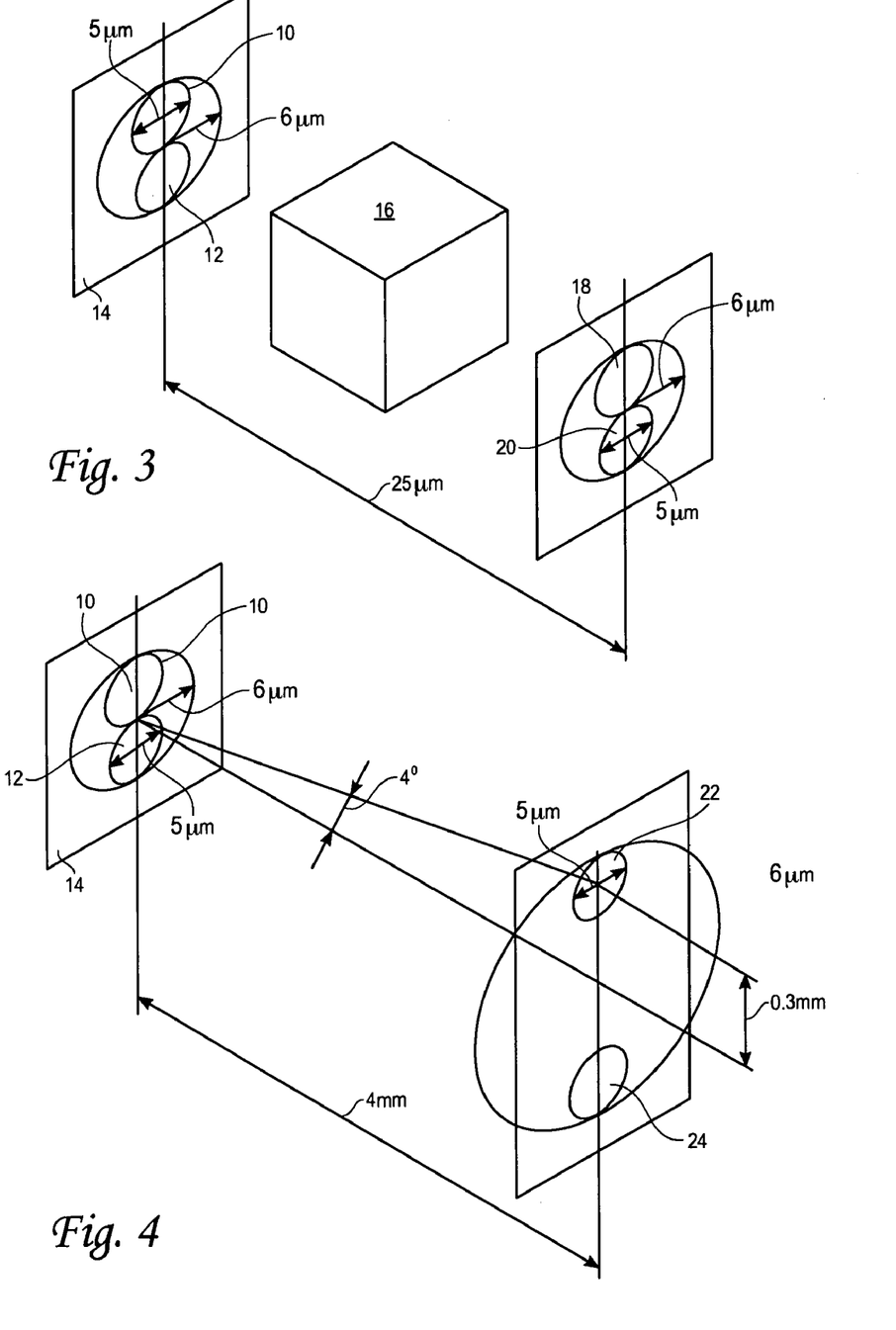
FIG. 3 shows a device for coupling the near field laser output of two coupled VCSELs to two receivers by using a micro lens system.
FIG. 4 shows a device for coupling the far field laser output of two coupled VCSELs to two receivers.

FIG. 3 shows a proposed switching device that would transfer the near laser field emitted by two coupled VCSELS to two receivers by using a micro lens system. In FIG. 3, VCSELs 10 and 12 each have an output aperture diameter of 5_m located at a plane 14. The output aperture of each VCSEL, 10 and 12, is located within a circle of diameter of 12 μm. With an appropriate micro lens system 16, as would be understood by those skilled in the art, the near field beam is directed to two receivers, 18 and 20, located 25 μm from the output apertures of the VCSELs, 10 and 12.

FIG. 4 illustrates a far field device where the same two VCSELs, 10 and 12, produce an output beam that is not directed through a micro lens system. In this version, the far field beam oscillates between plus and minus 4 degrees, so that at 4 mm from the VCSELs, the beam is oscillating between two receivers, (each 5 microns in diameter), that are separated by 0.6 mm. Two receivers, 22 and 24, spaced apart by 0.6 mm, are located 4 mm from the output apertures of VCSELs 10 and 12.

Where two circular cross section VCSEL lasers, each having a diameter of about d=5.6 μm, are separated (perimeter-to-perimeter) by a separation distance ρ and are driven by a common constant current source with current above a threshold current value, a coupled output beam from the two VCSEL lasers will exhibit coherent coupling and the oscillation described above, only if the separation distance ρ lies in an approximate range $0.4 \mu m \leq \rho \leq 1.2 \mu m$; and the degree of coherent coupling is maximized for $\rho \approx 0.8 \mu m$. The upper and lower limits for this range will tend to increase with increase in the diameter d, but the relationship may not be linear.

Figure 5:
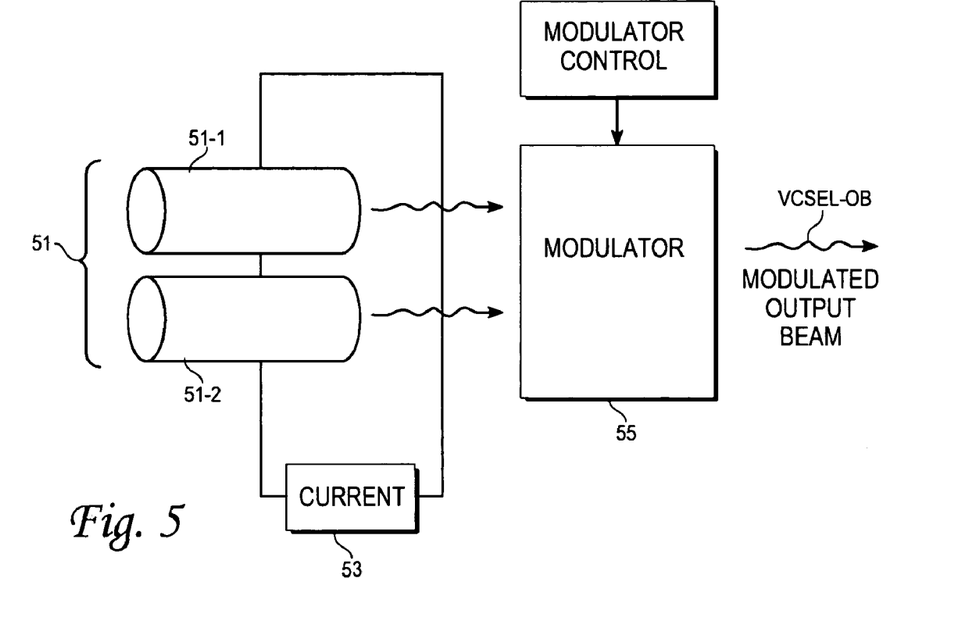
FIG. 5 schematically illustrates an embodiment of the invention.

A new method of optical data generation is disclosed that uses an external modulator together with an array of coherently coupled vertical-cavity, surface-emitting lasers (VCSELs). This is illustrated in FIG. 5, which positions an array of two or more parallel VCSEL lasers $51$-$j$($j$=1, ... J; J≧2), each having substantially the same regular cross sectional shape and being arranged in a regular pattern with a nearest neighbor separation distance ρ within a selected range. Each VCSEL laser 51-$j$ is driven by a common constant current source 53 with a current value above a selected current threshold. An optical pulse train OPT is received and processed by an external modulator 55. The external modulator 55 imposes a signal on the optical pulse train OPT to provide an optical data stream ODS. The data stream has two distinct values: pulse present ("1") and pulse absent ("0"), in response to receipt of a stream of modulator control signals S(t;mod) from an external modulator control module 57.

The invention uses the external modulator to generate an optical data bit stream of zeroes and ones from the optical pulse train OPT that is generated from the coherently coupled VCSELs. Some of the pulse trains that are generated by the VCSEL array have pulse rates in a range of 30-50 GHz. This is well within the capability of current external modulators, which can modulate up to 75 GHz. A first step is generation and transmission of an optical pulse train by the coherently coupled VCSELs. A second step is reception of the optical pulse train by the external modulator and the application of modulation to produce a controllable data stream.

If amplitude-shift keying (ASK) is used, the external modulator blocks a pulse in the pulse train whenever a "0", is to be transmitted and passes a pulse in the pulse train whenever a "1" is to be transmitted. An apparatus embedding this method would consist of two devices. The first device includes the coherently coupled VCSELs and current source, which produce the optical pulse train. The second device is a modulator, which is receives the optical pulse train and uses those pulses to generate an optical data bit stream.

If phase-shift keying (PSK) is used, the modulator passes a pulse whenever a "0" is to be transmitted and shifts the phase of the pulse by phi radians whenever a "1" is to be transmitted, or inversely. An apparatus embedding this method would consist of two devices. The first device would be the coherently coupled VCSELs, which are producing the optical pulse train. The second device would be the external modulator, which is receiving the optical pulse train and using those pulses to generate an optical data bit stream.

If frequency-shift keying (FSK) is used, the external modulator decreases the carrier frequency slightly whenever a zero, "0" is to be transmitted and increases the carrier frequency slightly whenever a one, "1" is to be transmitted. The first device would be the coherently coupled VCSELs, which are producing the optical pulse train. The second device would be the external modulator, which is receiving the optical pulse train and using those pulses to generate an optical data bit stream.

Figure 6:
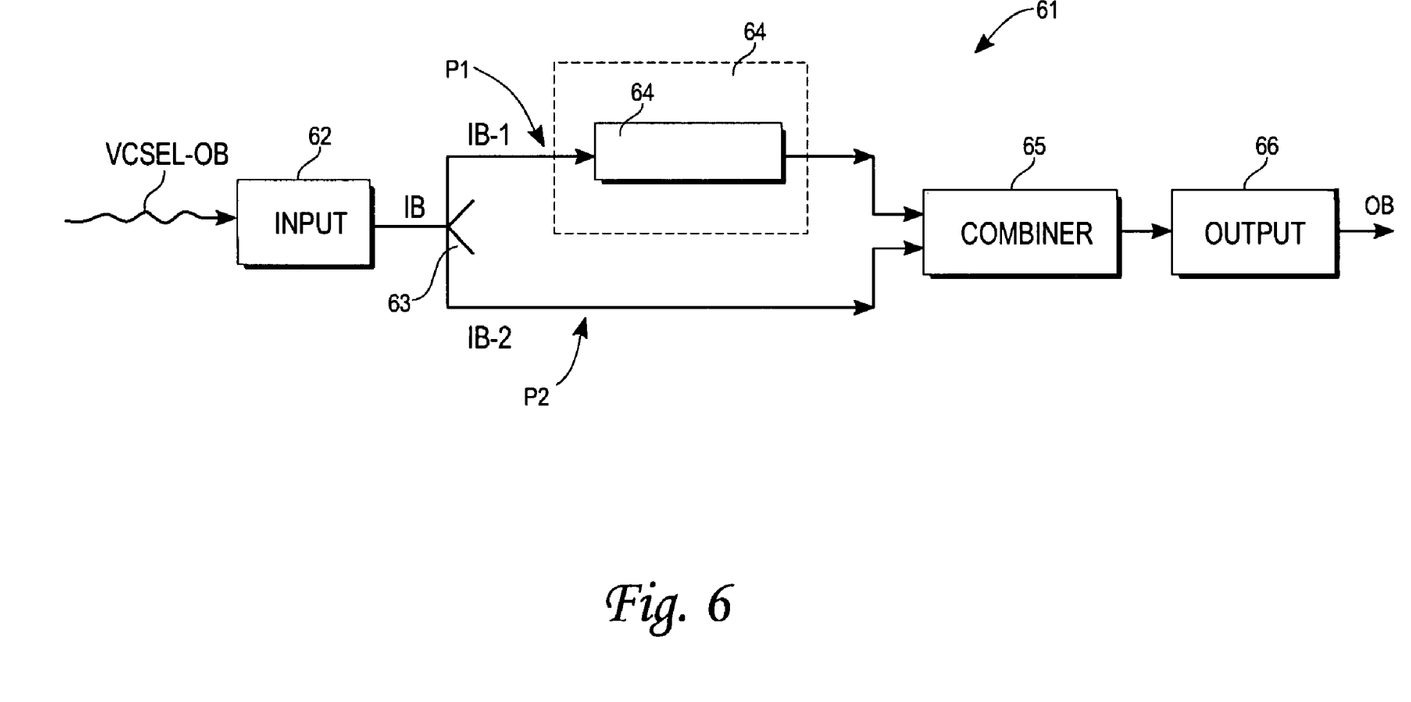
FIGS. 6, 7 and 8 show examples of suitable external modulator systems, a Mach-Zehnder interferometer, a Fabry-Perot etalon an electro-absorption module.

FIG. 6 schematically illustrates a suitable external modulator, configured as a Mach-Zehnder interferometer (MZI) 61. This modulator includes an input terminal 62 that receives the oscillating output beam VCSEL-OB from a VCSEL array (not shown in FIG. 6) and directs this input beam IB to an MZI 63. The MZI 63 splits the input beam IB into first and second equal intensity components, IB-1 and IB-2, that are directed along the respective paths P1 and P2. The first input beam component IB-1 passes through a phase modification segment 64 that introduces a selected phase change $\Delta\phi$ at an output terminal of the phase modification segment, relative to what the phase would be at that location in the absence of the phase modification segment. The beams IB-1 (with phase change $\Delta\phi$) and IB-2 are combined in a beam combiner 65, and the combination of the beams issues at an output terminal 66. In the absence of the phase modification segment 64, the optical lengths, L1 and L2, of the respective paths, P1 and P2, would be equal, or would differ by an integer multiple of $\lambda$, the wavelength of the input beam IB, and the beam OB that issues from the output terminal 65 would be substantially equal to the input beam IB.

The phase change $$\Delta\phi = 2\pi(L1-L2)/\lambda, \quad (1A)$$

has an equivalent time delay $$\tau = (L1-L2)/c, \quad (1B)$$

where c is the velocity of light in the transmission medium (e.g., a fiber). The phase change in the beam IB-1 results in a combined output beam with an intensity $$I(f\tau) = I_0\{1+\cos(2\pi f\tau)\}/2 = \cos^2(\pi f\tau), \quad (2)$$

where $I_0$ and f are the intensity and frequency of the input beam IB. Where the quantity $f\tau$ is an integer (0, ±1, ±2, etc.), the output beam will be substantially the same as the output beam, apart from an overall phase shift. Where the quantity $f\tau$ is a half integer (±(½), ±(3/2), etc.), the output beam will have an intensity of substantially 0. The phase change $\Delta\phi$ may be introduced by changing a strength of an electrical field E or of a magnetic field B that is impressed on the phase modification segment, or changing an optical length of the segment itself, by a piezoelectric effect or temperature change, for example. Alternatively, each of the paths, P1 and P2, may include a phase modification segment, 64A and 64B.

The active material used in the MZI shown in FIG. 6 can be $LiNbO_3$, $TaNbO_3$ or any other suitable material that responds to at least one of change in electrical field E impressed, change in magnetic field B impressed, or change in ambient temperature T by a controllable, preferably continuous change in optical length of the active element.

Figure 7:
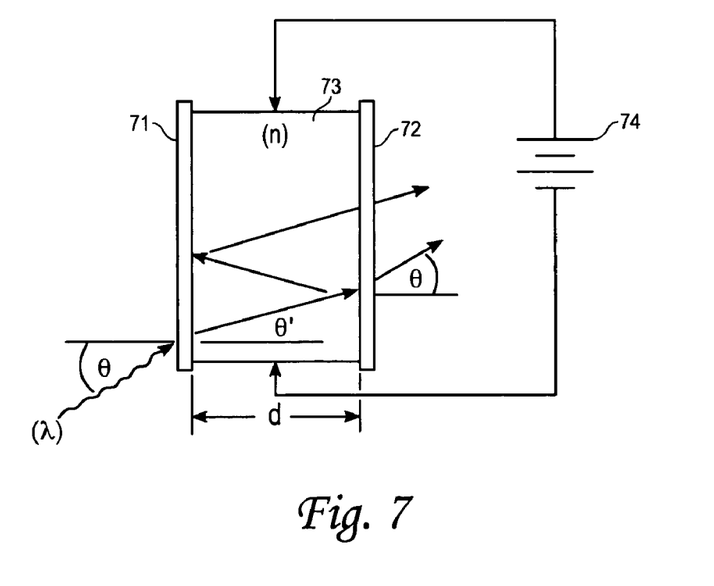

FIG. 7 schematically illustrates another suitable modulator, a Fabry-Perot etalon, as discussed by A. Yariv in *Optical Electronics in Modern Communications*, Oxford Univ. Press, New York, 1997, pp. 125-131. In one embodiment, an F-P etalon includes first and second parallel mirrors, 71 and 72, each with a selected reflectivity r ($\approx 0$), separated by a selected distance d, with an intermediate layer 73 of optically transparent material, having a refractive index n and a thickness d, located between the two mirrors. The first mirror 71 receives an input light beam IB, having a wavelength $\lambda$, at an incidence angle $\theta$ ($0 \leq \theta < \pi/2$), reflects a portion proportional to r and transmits a portion IB'($\theta$;r) proportional to 1−r, which travels through the intermediate layer 73 with a corresponding transmission angle $\theta'$ and encounters the second mirror 72. At the second mirror 72, a portion (proportional to 1−r) of the transmitted beam IB'($\theta$;r) is reflected into the intermediate layer 73 and a transmitted portion IB''($\theta$;r) issues from the second mirror 72 with an incidence angle $\theta$. The wave reflected at the second layer 72 travels back through the intermediate layer 73, is partly reflected at the first mirror 71, and arrives at the second mirror again, with a phase difference of $$\delta = 4\pi n d \cos \theta / \lambda. \quad (3)$$

The intensity I of the sum of all the input beam contributions that issue from the second mirror 72 is related to the initial beam intensity I0 by $$I/I0 = 4r^2 \sin^2(\delta/2)/\{(1-r^2)^2 + 4r^2 \sin^2(\delta/2)\} \quad (4)$$

By quickly varying the refractive index n and or the thickness d, the ratio I/I0 can be quickly switched between substantially full transmission and substantially no transmission. A change in refractive index n can be implemented by providing a material such as $CS_2$ and applying an electrical field E having a first value (which may be 0) and a second value different from the first value to implement beam switching, using a voltage difference module 74 Alternatively, an ambient temperature of the intermediate layer 73 can be varied to vary the refractive index and to implement the switching. Alternatively, the intermediate layer 73 may be a piezoelectric material whose thickness d responds to change in applied voltage, to implement the switching. Optionally, the first and second mirrors, 71 and 72, and the intermediate layer 73 may be combined in a single solid layer of electromagnetically active material.

Figure 8:
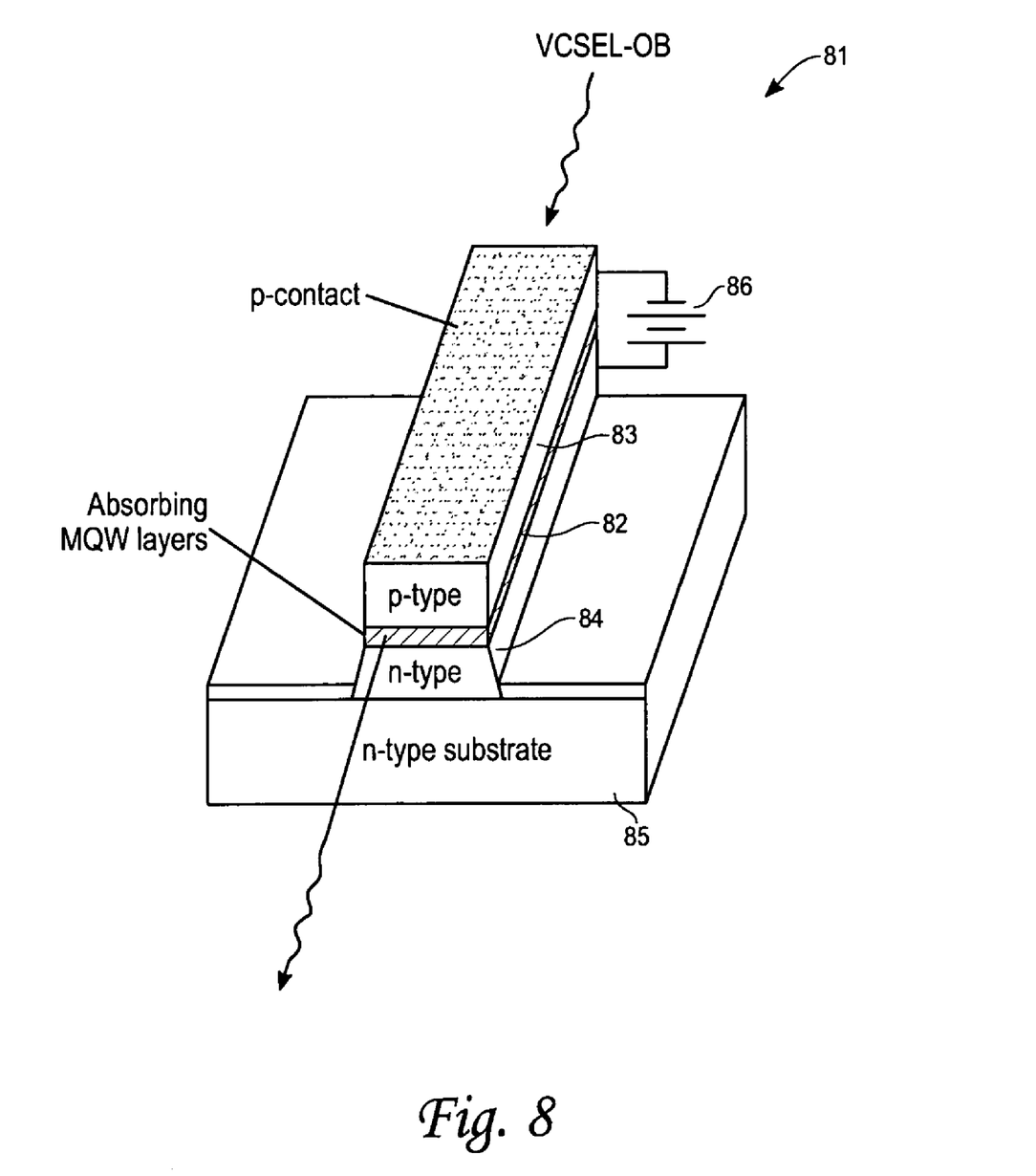

FIG. 8 schematically illustrates another suitable external modulator, configured as an electro-absorber module 81 based on semiconductor modulation. A multiple quantum well (MQW) structure semiconductor layer 82 (e.g., GaAs or $Al_{1-x}Ga_xAs$ or $In_{1-y}Ga_yAs$ with $0 < x \leq 1$ and $0 < y \leq 1$) is positioned between a p-type semiconductor layer 83 and an n-type semiconductor layer 84, and this multi-layer structure is optionally carried on a semiconductor substrate 85 (preferably n-type for the configuration shown in FIG. 8). The p-type layer 83 and n-type layer 84 are connected to opposite terminals of a fast switching voltage source 86 that can switch between first and second voltage difference states in a time interval of length at most about 10 nanoseconds (nsec). When the voltage source 86 is in a first state, an optical beam VCSEL-OB that is received by the MQW layer 82 is absorbed by this layer, because the height of the energy bandgap is less than the photon energy E($\lambda$) associated with the input optical beam. When the voltage source 86 is in a second state, an optical beam VCSEL-OB that is received by the MQW layer 82 is passed through this layer with relatively minor absorption, because the bandgap height is much larger than the energy E($\lambda$) so that little or no beam energy is absorbed by the layer 82. Proceeding in this manner, the input beam VCSEL is absorbed by or passed through the layer 82, depending upon the voltage difference impressed across the layer 82.

What is claimed is:

1. A method for communicating with a high rate of information transfer, the method comprising:
   providing two or more vertical cavity surface emitting lasers (VCSELs), spaced apart by a selected separation gap that is no greater than one fourth of a diameter of a VCSEL array element so that the VCSELs are coherently coupled together;
   providing a common current source connected to all of the VCSELs to provide a steady current biased above a selected threshold current to all of the VCSELs simultaneously, wherein the coherent coupling of the VCSELs produces a near field beam pattern of first and second spaced apart near field beam spots with respective first and second near field beam spot intensities that oscillate relative to each other with a frequency that is at least 32 GHz; and
   providing a light modulator that receives at least one of the near field beam spots, the modulator having a first state that transmits a received beam, having a second state that does not transmit the received beam, and having a modulator control that switches the modulator between the first state and the second state according to a control signal received by the modulator control.

2. The method of claim 1, further comprising choosing said modulator from a group of modulators consisting of a Mach-Zehnder interferometer having a first optical arm and a second optical arm, a Fabry Perot etalon, and a semiconductor-based electro-absorption transmission channel.

3. The method of claim 2, further comprising providing a phase modification segment in said first optical arm of said Mach-Zehnder interferometer that allows a controllable change in optical length of said first optical arm.

4. The method of claim 3, further comprising providing said phase modification segment with a module that allows a controllable change in at least one of: an electrical field strength in a selected region that includes said phase modification segment, a magnetic field strength in the selected region, and an optical length of said first optical arm.

5. The method of claim 4, further comprising including in said phase modification segment a material drawn from the group of materials consisting of $LiNbO_3$ and $TaNbO_3$.

6. The method of claim 3, further comprising providing said change in said optical length of said first arm by at least one of the following: (i) change in temperature of at least one structural component in said first arm and (ii) change in a voltage impressed on a piezoelectric component that is at least one structural component in said first arm.

7. The method of claim 2, further comprising providing said Fabry-Perot etalon with an intermediate layer of selected material having a refractive index that changes controllably in response to change of an electrical field impressed on the intermediate layer.

8. The method of claim 7, further comprising including $CS_2$ in said intermediate layer.

9. The method of claim 2, further comprising providing said Fabry-Perot etalon with an intermediate layer of material having a refractive index that changes controllably in response to change of a temperature impressed on the intermediate layer.

10. The method of claim 2, further comprising providing said semiconductor-based electro-absorption transmission channel with a multiple quantum well layer, positioned between a p-type semiconductor layer and an n-type semiconductor layer, with a voltage source that provides a voltage difference across the quantum well layer, and with a voltage source control that controllably switches the voltage difference between a first voltage difference value and a second voltage difference value.

11. The method of claim 10, further comprising including in said multiple quantum well layer at least one material drawn from the group of materials consisting of GaAs, $Al_{1-x}Ga_xAs$ and $In_{1-y}Ga_yAs$ with $0<x\leq1$ and $0<y\leq1$.

12. The method of claim 1, further comprising switching said modulator between said first state and said second state at a switching rate of at least 30 GHz.

13. The method of claim 1, further comprising switching said modulator between said first state and said second state at a switching rate of at least 75 GHz.

14. The method of claim 1, further comprising providing each of said at least two VCSELs with a substantially circular cross section.

15. The method of claim 1, further comprising selecting said diameter of each of said VCSELs to be substantially 5.6 microns.

16. The method of claim 1, further comprising providing each of said at least two VCSELs with a substantially square cross section.

17. The method of claim 1, further comprising causing said output laser beam to oscillate between a first beam position and at least one beam position that differs from the first beam position with at least one of the frequencies 32 GHz, 41 GHz and 50 GHz.

18. A system for communicating with a high rate of information transfer, the system comprising:
   two or more vertical cavity surface emitting lasers (VCSELs), spaced apart by a selected separation gap that is no greater than one fourth of a diameter of a VCSEL array element so that the VCSELs are coherently coupled together;
   a common current source connected to all of the VCSELs to provide a steady current biased above a selected threshold current to all of the VCSELs simultaneously, wherein the coherent coupling of the VCSELs produces a near field beam pattern of first and second spaced apart near field beam spots with respective first and second near field beam spot intensities that oscillate relative to each other with a frequency that is at least 32 GHz; and
   a light modulator that receives at least one of the near field beam spots, the modulator having a first state that transmits a received beam, having a second state that does not transmit the received beam, and having a modulator control that switches the modulator between the first state and the second state according to a control signal received by the modulator control.

19. The system of claim 18, wherein said modulator is chosen from a group of modulators consisting of a Mach-Zehnder interferometer having a first optical arm and a second optical arm, a Fabry Perot etalon, and a semiconductor-based electro-absorption transmission channel.

20. The system of claim 19, wherein said first optical arm of said Mach-Zehnder interferometer is provided with a phase modification segment that allows a controllable change in optical length of said first optical arm.

21. The system of claim 20, wherein said phase modification segment is provided with a module that allows a controllable change in at least one of: an electrical field strength in a selected region that includes said phase modification segment, a magnetic field strength in the selected region, and an optical length of said first optical arm.

22. The system of claim 21, wherein said phase modification segment includes a material drawn from the group of materials consisting of $LiNbO_3$ and $TaNbO_3$.

23. The system of claim 20, wherein said change in said optical length of said first arm is provided by at least one of the following: (i) change in temperature of at least one structural component in said first arm and (ii) change in a voltage impressed on a piezoelectric component that is at least one structural component in said first arm.

24. The system of claim 19, wherein said Fabry-Perot etalon is provided with an intermediate layer of selected material having a refractive index that changes controllably in response to change of an electrical field impressed on the intermediate layer.

25. The system of claim 24, wherein $CS_2$ is included in said intermediate layer.

26. The system of claim 19, wherein said Fabry-Perot etalon is provided with an intermediate layer of material having a refractive index that changes controllably in response to change of a temperature impressed on the intermediate layer.

27. The system of claim 19, wherein said semiconductor-based electro-absorption transmission channel is provided with a multiple quantum well layer, positioned between a p-type semiconductor layer and an n-type semiconductor layer, with a voltage source that provides a voltage difference across the quantum well layer, and with a voltage source control that controllably switches the voltage difference between a first voltage difference value and a second voltage difference value.

28. The system of claim 27, wherein said multiple quantum well layer includes at least one material drawn from the group of materials consisting of GaAs, $Al_{1-x}Ga_xAs$ and $In_{1-y}Ga_yAs$ with $0<x\leq1$ and $0<y\leq1$.

29. The system of claim 18, wherein said modulator switches between said first state and said second state at a switching rate of at least 30 GHz.

30. The system of claim 18, wherein said modulator switches between said first state and said second state at a switching rate of at least 75 GHz.

31. The system of claim 18, wherein each of said at least two VCSELs is provided with a substantially circular cross section.

32. The system of claim 18, wherein said diameter of each of said VCSELs is chosen to be substantially 5.6 microns.

33. The system of claim 18, wherein each of said at least two VCSELs is provided with a substantially square cross section.

34. The system of claim 18, wherein said output laser beam is caused to oscillate between a first beam position and at least one beam position that differs from the first beam position with at least one of the frequencies 32 GHz, 41 GHz and 50 GHz.

* * * * *